(12) United States Patent
Garrity

(10) Patent No.: US 8,344,798 B2
(45) Date of Patent: Jan. 1, 2013

(54) CORRELATED-DOUBLE-SAMPLING SWITCHED-CAPACITOR GAIN STAGES, SYSTEMS IMPLEMENTING THE GAIN STAGES, AND METHODS OF THEIR OPERATION

(75) Inventor: Douglas A. Garrity, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 34 days.

(21) Appl. No.: 13/075,844

(22) Filed: Mar. 30, 2011

(65) Prior Publication Data

US 2012/0249239 A1 Oct. 4, 2012

(51) Int. Cl.
H03F 1/02 (2006.01)
(52) U.S. Cl. ............................. 330/9; 327/124
(58) Field of Classification Search ...... 330/9; 327/124, 327/96, 307
See application file for complete search history.

(56) References Cited

U.S. PATENT DOCUMENTS

| | | | |
|---|---|---|---|
| 5,644,313 A | 7/1997 | Rakers et al. | |
| 6,037,836 A * | 3/2000 | Yoshizawa | 330/9 |
| 6,215,337 B1 | 4/2001 | Bazarjani | |
| 6,608,583 B1 | 8/2003 | Konno | |
| 7,034,737 B1 | 4/2006 | Huang | |
| 7,064,700 B1 | 6/2006 | Garrity et al. | |
| 7,595,666 B2 * | 9/2009 | Braswell et al. | 327/96 |
| 8,026,760 B1 * | 9/2011 | Prasad | 330/9 |
| 8,198,937 B1 | 6/2012 | Vilas Boas et al. | |
| 2009/0033371 A1 * | 2/2009 | Braswell et al. | 327/65 |

OTHER PUBLICATIONS

Enz, C., et al., Circuit Techniques for Reducing the Effects of Op-Amp Imperfections: Autozeroing, Correlated Double Sampling, and Chopper Stabilization, Proceedings of the IEEE, vol. 84, No. 11, Nov. 1996.
Garrity, D, et al., A Single Analog-to-Digital Converter that Converts Two Separate Channels (I and Q) in a Broadband Radio Receiver, IEEE JSSC, vol. 43, No. 6, Jun. 2008.
Nagaraj, K., et al., Switched-Capacitor Circuits with Reduced Sensitivity to Amplifier Gain, IEEE Trans. Ckts. & Syst. vol. CAS 34, pp. 571-574, May 1987.
Nagaraj, K., et al., Switched-Capacitor Integrator with Reduced Sensitivity to Amplifier Gain, Electronic Letter, vol. 22, No. 21, Oct. 9, 1986.
Gregorie, B. et al., An Over-60 dB True Rail-to-Rail Performance Using Correlated Level Shifting and an Opamp With Only 30 dB Loop Gain, IEEE JSSC, vol. 43, No. 12, Dec. 2008.
U.S. Appl. No. 13/075,956, Garrity, et al., "Correlated-Level-Shifting and Correlated-Double-Sampling Switched-Capacitor Gain Stages, Systems Implementing the Gain Stages, and Methods of Their Operation", filed Mar. 30, 2011, Office Action—Noticed of Allowance mailed Oct. 11, 2012.

* cited by examiner

*Primary Examiner* — Henry Choe
(74) *Attorney, Agent, or Firm* — Sherry W. Schumm

(57) ABSTRACT

Embodiments of switched-capacitor gain stage circuits and methods of their operation are provided. The circuit includes an operational amplifier, parallel sampling capacitors, an offset storage capacitor coupled to an amplifier input, and multiple switches that are configurable to place the gain stage circuit in a sampling state, a gain state, and an output state. In the sampling state, the switches are configured so that a first charge component representing an input signal is stored on the sampling capacitors, and a second charge component representing an amplifier offset voltage is stored on the offset storage capacitor. In the gain state, the switches are configured so that a third charge component representing a finite gain of the amplifier is stored on the offset storage capacitor. In the output state, the switches are configured so that the first, second, and third charge components contribute to an output signal produced at the output node.

20 Claims, 5 Drawing Sheets

CORRELATED-DOUBLE-SAMPLING SWITCHED-CAPACITOR GAIN STAGES, SYSTEMS IMPLEMENTING THE GAIN STAGES, AND METHODS OF THEIR OPERATION

RELATED APPLICATION

This application is related to co-pending, U.S. patent application Ser. No. 13/075,956, entitled "CORRELATED-LEVEL-SHIFTING AND CORRELATED-DOUBLE-SAMPLING SWITCHED-CAPACITOR GAIN STAGES, SYSTEMS IMPLEMENTING THE GAIN STAGES, AND METHODS OF THEIR OPERATION," filed concurrently herewith.

TECHNICAL FIELD

Embodiments relate to switched-capacitor gain stages, systems in which such gain stages are implemented, and methods of their operation.

BACKGROUND

A variety of analog signal processing circuits include a gain stage configured to amplify an input analog signal. For example, switched-capacitor gain circuits are commonly used to provide such amplification. A typical switched-capacitor gain circuit includes an amplifier (e.g., an operational amplifier) and a set of capacitors onto which an input signal sample may be stored. The stored input signal is subsequently amplified and output from the gain circuit. Although contemporary switched-capacitor gain circuits function well in a variety of applications, they do have some drawbacks. For example, the finite gain of the amplifier, flicker noise (sometimes referred to as "1/f noise"), and DC offsets detrimentally affect the achievable accuracy of such circuits.

To compensate for amplifier imperfections that limit the achievable accuracy of switched-capacitor circuits, a technique referred to as correlated-double-sampling has been implemented in some gain circuits. Correlated-double-sampling generally refers to a sampling technique in which the strength of a signal at a node is determined as a difference between the strength of the signal at the node when the signal is coupled to the node and the strength of the signal at the node when the signal is decoupled from the node. Although correlated-double-sampling techniques may improve the achievable accuracy of switched-capacitor circuits, the accuracy improvements come at a cost. More particularly, some prior correlated-double-sampling, switched-capacitor circuits include significantly more circuitry to perform correlated-double-sampling, thus increasing the overall cost and complexity of the gain stage. In addition or alternatively, many prior correlated-double-sampling, switched-capacitor circuits impose limitations on the bandwidth of the input signal that may be processed.

DETAILED DESCRIPTION

Figure 1:
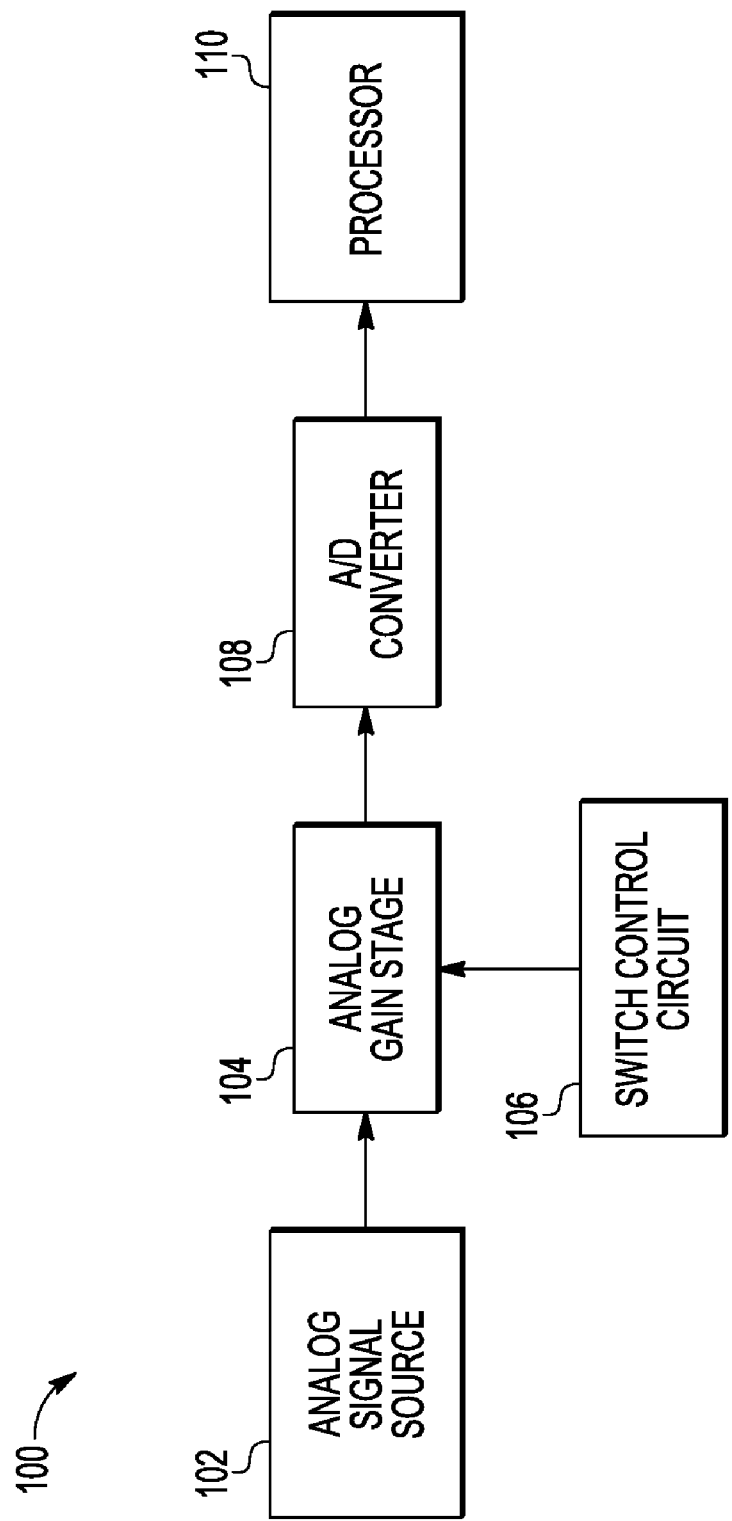
FIG. 1 is a simplified block diagram of an embodiment of an electronic system within which one or more gain stages according to various embodiments may be incorporated.

Embodiments include gain stage circuits in which correlated-double-sampling techniques are implemented, and methods for operating such gain stage circuits. The various gain stage embodiments described herein may be used in conjunction with or integrated within any of a variety of electronic systems and circuits that may benefit from including a gain stage having the advantages and characteristics of the disclosed embodiments. In a particular embodiment, an embodiment of a gain stage may be utilized as an input stage to an analog to digital converter.

Various embodiments of gain stage circuits are discussed below. In some of the below discussed embodiments, the gain stage circuits are described to include "capacitors" and "switches." It is to be understood that any reference to a "capacitor" or "switch" in the description or claims should be interpreted to mean either a single, distinct component (e.g., a single capacitor or switch) or a circuit or network that includes multiple interconnected components of a particular type (e.g., a capacitor circuit or a switching circuit). Similarly, references to a "capacitor circuit" or a "switching circuit" in the description or claims may be interpreted to mean multiple interconnected components of a particular type or a single, distinct component. In various embodiments, the components (e.g., the capacitors and switches) may be implemented as discrete (i.e., separately packaged) components or components that are implemented in one or more integrated circuits.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode). The following description refers to nodes or features being "connected" or "coupled" together. As used herein, unless expressly stated otherwise, "coupled" means that one node/feature is directly or indirectly joined to (or is in direct or indirect communication with) another node/feature, and not necessarily physically. As used herein, unless expressly stated otherwise, "connected" means that one node/feature is directly joined to (or is in direct communication with) another node/feature. For example, a switch may be "coupled" to a plurality of nodes, but all of those nodes need not always be "connected" to each other; the switch may connect different nodes to each other depending upon the state of the switch. Furthermore, although the various schematics shown herein depict certain example arrangements of elements, additional intervening elements, devices, features, or components may be present in an actual embodiment, assuming that the functionality of the given circuit is not adversely affected.

In the description herein, various circuit elements are described as being coupled to a "ground reference." It is to be understood that the various circuit elements may be coupled to a same ground reference (i.e., a same reference voltage or ground), in an embodiment, or to different ground references (i.e., different reference voltages) in various other embodiments. Therefore, references to various circuit elements as being coupled to "a ground reference" should not be interpreted as meaning that all such circuit elements are coupled to the same ground reference, although they may be, in an embodiment. Similarly, references to various circuit elements as being coupled to a "first," "second," or "third" ground reference may mean that the circuit elements are coupled to a same ground reference or to different ground references, in various embodiments.

FIG. 1 is a simplified block diagram of an embodiment of an electronic system 100 within which one or more gain stages according to various embodiments may be incorporated. Electronic system 100 may be a stand-alone system, or may form a portion of a larger system, including but not limited to a computer, a wired or wireless communication device (e.g., a cellular telephone or radio), a radio frequency (RF) receiver, an RF transmitter, an appliance, a gaming system, a sensor interface, an electricity meter, a power meter, a video recording and display system, a vehicle braking unit, and an engine control unit, to name a few. System 100 includes an analog signal source 102, an analog gain stage 104, a switch control circuit 106, an analog to digital (A/D) converter 108, and a processor 110. Analog signal source 102 may be any suitable source of an analog signal, including but not limited to a sensor, an audio input circuit, a receiver, a pressure sensor in an engine or tire, a camera, a current transformer, and so on.

According to an embodiment, the analog signal produced by analog signal source 102 is received and processed by analog gain stage 104. As will be described in greater detail below, analog gain stage 104 includes a finite gain amplifier, sampling and offset storage capacitors, and a plurality of switches that are controlled via switch control signals produced by switch control circuit 106. The inclusion of the offset storage capacitor and the method by which the switches are controlled results in the production of an output voltage signal, by analog gain stage 104, which the amplifier offset voltage has been cancelled, flicker noise is suppressed, and the finite gain of amplifier is compensated.

According to an embodiment, analog gain stage 104 may be an input stage to A/D converter 108 (and thus may form a portion of A/D converter 108). Alternatively, analog gain stage 104 may be distinct from A/D converter 108 as shown in FIG. 1. Either way, the output voltage signal produced by analog gain stage 104 may be sampled by A/D converter 108, which may produce a series of digital values representing the output voltage signal. These digital values may be further processed by processor 110. Processor 110 may be, for example, a general or special purpose processor, a digital signal processor, an application specific integrated circuit, or various other types of circuits configured to process digital samples.

Figure 2:
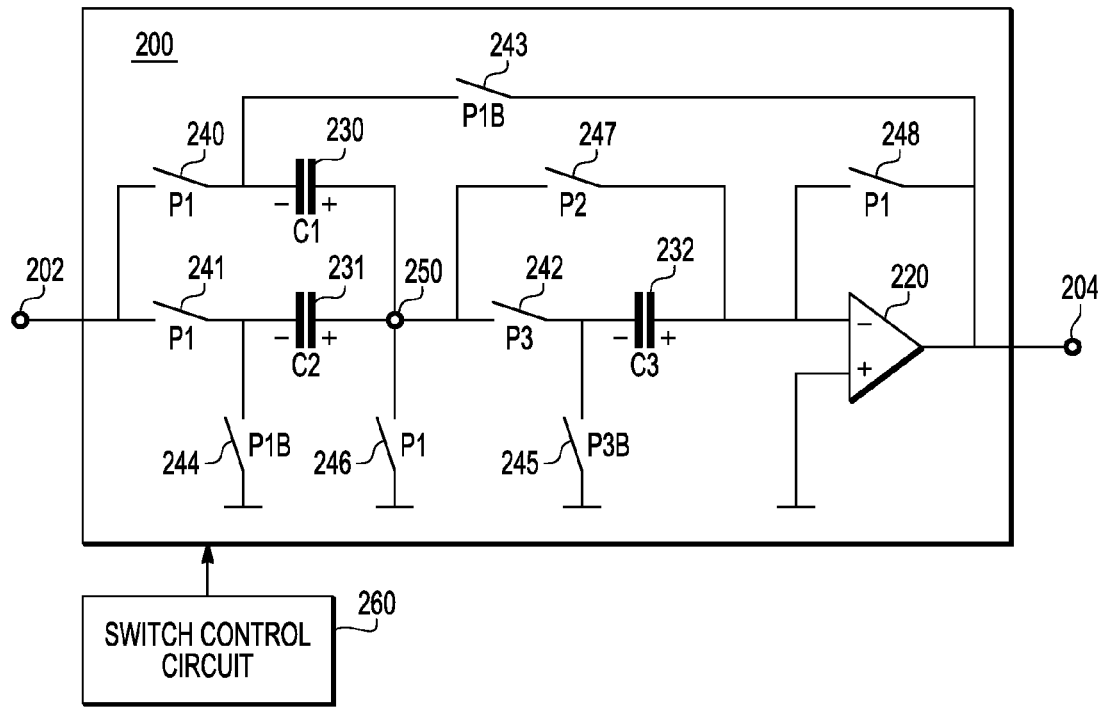
FIG. 2 is a simplified schematic diagram of a gain stage circuit, according to an example embodiment.

FIG. 2 is a simplified schematic diagram of a gain stage circuit 200 (e.g., analog gain stage 104, FIG. 1), according to an example embodiment. Although the simplified schematic shown in FIG. 2 (and FIGS. 4-6) is depicted in a single-ended configuration in order to simplify the explanation, a practical embodiment may be designed to be differential throughout a device within which a gain stage embodiment is implemented. Gain stage circuit 200 includes an input node 202 for receiving an input voltage signal, $v_{IN}$, an output node 204 for providing an output voltage, $v_{OUT}$ (e.g., a voltage sample sequence that is derived from the input voltage signal), an amplifier 220, a plurality of capacitors 230-232, and a plurality of switches 240-248. In an embodiment, amplifier 220 is an operational amplifier with a finite gain.

Each of capacitors 230-232 may be considered to have a first terminal and a second terminal. For purposes of convenience, capacitors 230-232 of FIG. 2 are shown with polarity markings ("+" and "−"). These markings are used solely for the purpose of indicating how the first and second terminals of each of the capacitors 230-232 are coupled to various nodes in gain stage circuit 200 in different operational states, and the markings are not meant to imply that any type of directional capacitors are necessarily used in gain stage circuit 200, although directional capacitors may be used. In the event that directional capacitors are used, their polarities may be the same as or different from the polarities shown in FIG. 2, in various embodiments.

According to an embodiment, the input node 202 is coupled, as shown, to first and second capacitor legs. As used herein, the term "capacitor leg" means a portion of a circuit that includes one or more capacitors electrically coupled between a first end and a second end of the circuit portion, and that may be characterized as having a particular capacitance. The first capacitor leg (including a first switch 240 in series with a first capacitor C1 230) and the second capacitor leg (including a second switch 241 in series with a second capacitor C2 231) are coupled in parallel with each other between their first and second ends, where the first ends are coupled to the input node 202, and the second ends are coupled to a "central node" 250. A third capacitor leg (including a third switch 242 in series with a third capacitor C3 232) has its first end coupled with the central node 250, and its second end coupled with the inverting input of amplifier 220. The non-inverting input of amplifier 220 may be coupled to a ground reference, in an embodiment.

The switches 240-242 in the first, second, and third capacitor legs form a portion of a switching configuration, which also includes switches 243-248. As will be described in more detail below, the switching configuration enables capacitors C1, C2, C3 230-232 to be electrically coupled and de-coupled from the input node 202, central node 250, ground reference, and amplifier output 204 in various manners during transition of the gain stage circuit 200 through various states. According to an embodiment, a fourth switch 243 is coupled between the output of amplifier 220 and a connection point between capacitor C1 230 and switch 240. A fifth switch 244 is coupled between a ground reference and a connection point between capacitor C2 231 and switch 241. A sixth switch 245 is coupled between a ground reference and a connection point between capacitor C3 232 and switch 242. A seventh switch 246 is coupled between a ground reference and the central node 250. In an embodiment, the fifth and seventh switches 244, 246 are coupled to different ground references (e.g., different reference voltages). In another embodiment, the fifth and seventh switches 244, 246 may be coupled to the same ground reference. An eighth switch 247 is coupled between the central node 250 and the inverting input of amplifier 220 (i.e., switch 247 is coupled in parallel with the third capacitor leg that includes capacitor C3 232). Finally, a ninth switch 248 is coupled between the output and the inverting input of amplifier 220.

Figure 3:
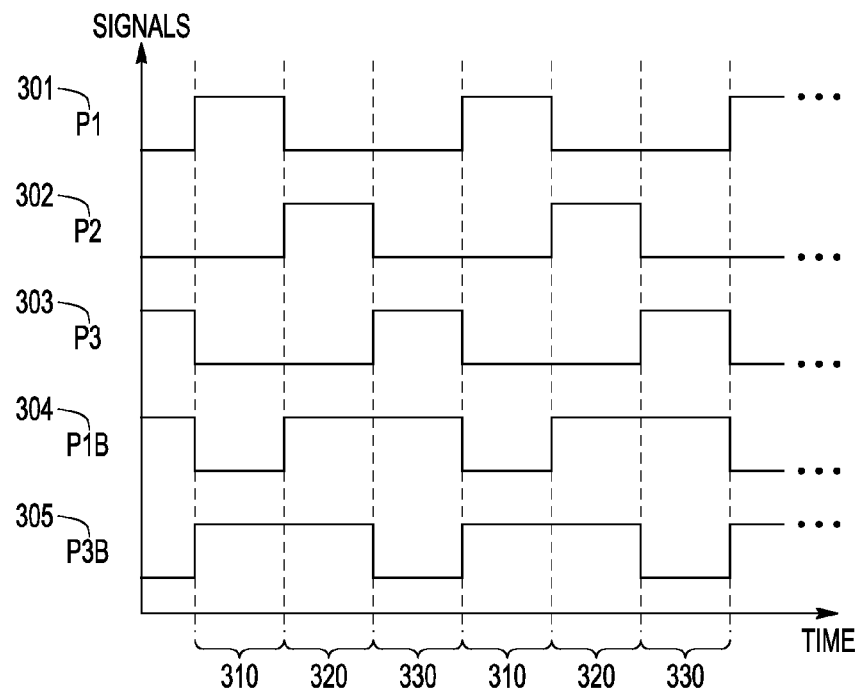
FIG. 3 is a diagram depicting the relative timing of example switch control signals that influence the operation of the gain stage of FIG. 2, according to an example embodiment.

Each of switches 240-248 may be implemented as a transistor (e.g., a metal oxide semiconductor field effect transistor (MOSFET), micro-electromechanical switch (MEMS), and so on), which may be placed in a conducting or non-conducting state based one of a plurality of switch control signals provided by switch control circuit 260. FIG. 3 is a diagram depicting the relative timing of example switch control signals 301-305, which may be provided by switch control circuit 260, and which may influence the operation of the gain stage circuit 200 of FIG. 2, according to an example embodiment. To facilitate understanding, FIGS. 2 and 3 should be viewed together, along with FIGS. 4-7 as referred to below.

As mentioned above, and according to an embodiment, a plurality of switch control signals 301-305 are provided to gain stage circuit 200 (and more particularly to switches 240-248) by switch control circuit 260. The switches in FIG. 2 are labeled with their respective governing switch control signal (e.g., P1, P2, P3, P1B, P3B). In the embodiments described herein, when a switch control signal 301-305 is in a relatively high voltage state, a switch to which the switch control signal 301-305 is provided will be in a conducting state (i.e., closed), thus producing a short circuit across the switch. Conversely, when a switch control signal 301-305 is in a relatively low voltage state, a switch to which the switch control signal 301-305 is provided will be in a non-conducting state (i.e., open), thus producing an open circuit at the switch. Those of skill in the art would understand that modifications to the apparatus and methods described herein could be made so that some or all of switches 240-248 alternatively may be controlled in an opposite manner (e.g., a high switch control voltage corresponds to a non-conducting switch state, and a low switch control voltage corresponds to a conducting switch state). Those of skill in the art also would understand that delayed and/or compliment versions of the various switch control signals 301-305 may be used to optimally control switches 240-248, and such modifications are included within the scope of the various embodiments.

Various phases in the provision of the switch control signals 301-305 correspond to various operational states of gain stage circuit 200. More particularly, and as will be described in more detail below, phase 310 of the switch control signals 301-305 corresponds to a sampling state (i.e., a state represented in FIG. 4), phase 320 corresponds to a gain state (i.e., a state represented in FIG. 5), and phase 330 corresponds to an output state (i.e., a state represented in FIG. 6). According to an embodiment, the switch control signals 301-305 are provided in a manner such that the transitions of switches 240-248 between one phase and another are non-overlapping (e.g., at the end of phase 310, the P1 signal 301 transitions low before the P2 signal 302 transitions high).

Phase 310 of the switch control signals 301-305 corresponds to the sampling state of gain stage circuit 200. In the sampling state, signals P1 301 and P3B 305 are high, and signals P2 302, P3 303, and P1B 304 are low. Accordingly, switches 240, 241, 246, and 248 (responsive to signal P1 301) and switch 245 (responsive to signal P3B 305) are closed, and switch 247 (responsive to signal P2 302), switch 242 (responsive to signal P3 303), and switches 243, 244 (responsive to signal P1B 304) are open. This configuration is represented in FIG. 4, which is a simplified schematic diagram of the gain stage circuit 200 in the sampling state, according to an example embodiment.

Figure 4:
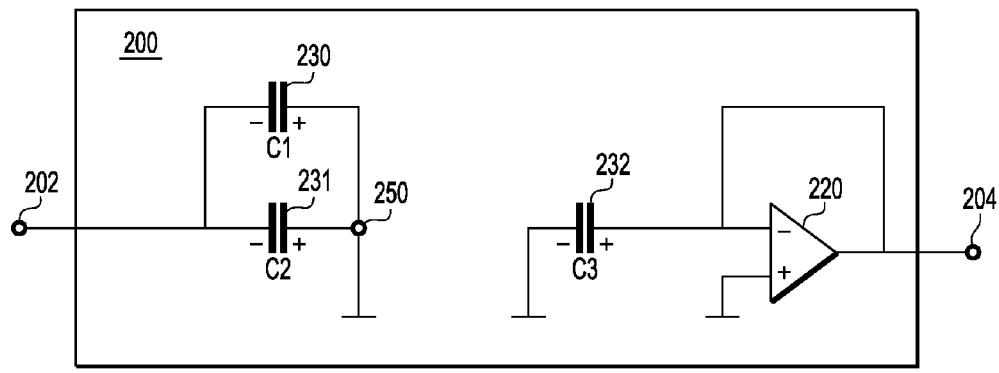
FIG. 4 is a simplified schematic diagram of the gain stage circuit of FIG. 2 in a sampling state, according to an example embodiment.

Referring to FIG. 4, it can be seen that, in the sampling state, capacitors C1 230 and C2 231 are coupled in parallel between the input node 202 and central node 250. Accordingly, the circuit 200 is configured so that capacitors C1 230 and C2 231 may sample and store charge components representing the value of the input signal present on input node 202 (e.g., each of capacitors C1 230, C2 231 sample the input signal voltage). For convenience, capacitors C1 230 and C2 231 may be referred to as "input sampling capacitors," herein. According to an embodiment, capacitors C1 230 and C2 231 have substantially equal values (e.g., they are "matched"), and accordingly the gain, $G_v$, of the gain stage circuit 200 equals approximately two (2) (i.e., $G_v=(C1+C2)/C1$). In various alternate embodiments, more than two capacitor legs may be coupled in parallel between the input and central nodes 202, 250, which may yield different voltage gains for the gain stage circuit 200. In addition, in other embodiments, the various input sampling capacitors may not be matched.

In addition, in the sampling state, capacitor C3 232 is decoupled from the central node 250, and is coupled between the inverting input of amplifier 220 and a ground reference. The output and inverting input of amplifier 220 are coupled, yielding unity gain from amplifier 220. In this configuration, capacitor C3 232 stores a charge component representing the voltage offset ($v_{OS}$) developed within amplifier 220 (referred to herein as the "amplifier offset voltage" or "input referred offset voltage"). In other words, $v_{OS}$ developed inside amplifier 220 is referred to the inverting input and to capacitor C3 232. Capacitor C3 232 also stores a charge component representing flicker noise (also referred to as "1/f" noise). As will be described in more detail later, the charge components stored on capacitor C3 232 are later applied through the gain stage circuit 200 in a manner that avoids amplifying the voltage offset and flicker noise, and thus that avoids or suppresses detrimental effects that these signal energies otherwise would have on the accuracy of the amplification provided by the gain stage circuit 200. For convenience, capacitor C3 232 may be referred to as an "offset storage capacitor," herein, although it is to be understood that capacitor C3 232 may store charge components representing energies in addition to the amplifier offset voltage (e.g., also the flicker noise).

Referring again to FIG. 3, phase 320 of the switch control signals 301-305 corresponds to the gain state of gain stage circuit 200. In the gain state, signals P2 302, P1B 304, and P3B 305 are high, and signals P1 301 and P3 303 are low. Accordingly, switch 247 (responsive to signal P2 302), switches 243, 244 (responsive to signal P1B 304), and switch 245 (responsive to signal P3B 305) are closed, and switches 240, 241, and 248 (responsive to signal P1 301) and switch 242 (responsive to signal P3 303) are open. This configuration is represented in FIG. 5, which is a simplified schematic diagram of the gain stage circuit 200 in the gain state, according to an example embodiment.

Figure 5:
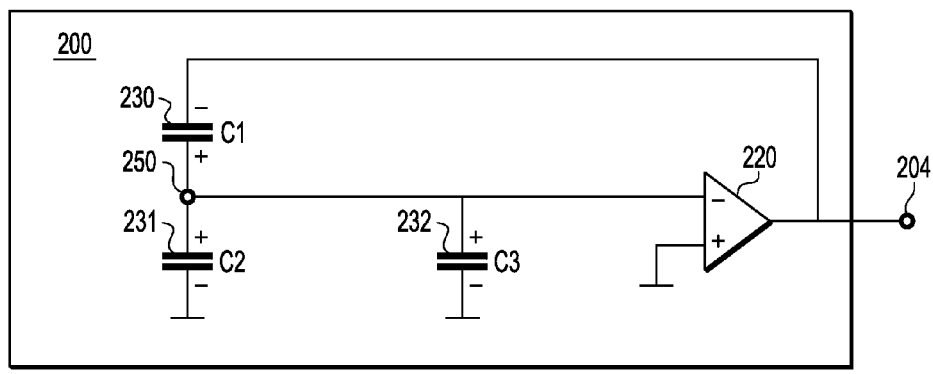
FIG. 5 is a simplified schematic diagram of the gain stage circuit of FIG. 2 in a gain state, according to an example embodiment.

Referring to FIG. 5, it can be seen that, in the gain state, capacitor C1 230 is coupled between the central node 250 and the output of amplifier 220, capacitor C2 231 is coupled between the central node 250 and a ground reference, and capacitor C3 232 is coupled, at a first terminal, to the central node 250 and inverting input to amplifier 220, and at a second terminal to a ground reference. In this configuration, charge components representing the amplifier offset voltage and flicker noise remain on capacitor C3 232, along with a charge component (e.g., derived from the signal being processed) that represents the finite amplifier gain. In an embodiment in which switches 244 and 246 are coupled to different ground references (e.g., different reference voltages), the ground reference voltage to which switch 244 is coupled is multiplied by the ratio of capacitor C2 231 over capacitor C1 230, and the resulting voltage is subtracted from the output voltage during the time when switch 243 is closed.

Referring again to FIG. 3, phase 330 of the switch control signals 301-305 corresponds to the output state of gain stage circuit 200. In the output state, signals P3 303 and P1B 304 are high, and signals P1 301, P2 302, and P3B 305 are low. Accordingly, switch 242 (responsive to signal P3 303) and switches 243, 244 (responsive to signal P1B 304) are closed, and switch 248 (responsive to signal P1 301), switch 247 (responsive to signal P2 302), and switch 245 (responsive to signal P3B 305) are open. This configuration is represented in FIG. 6, which is a simplified schematic diagram of the gain stage circuit 200 in the output state, according to an example embodiment.

Figure 6:
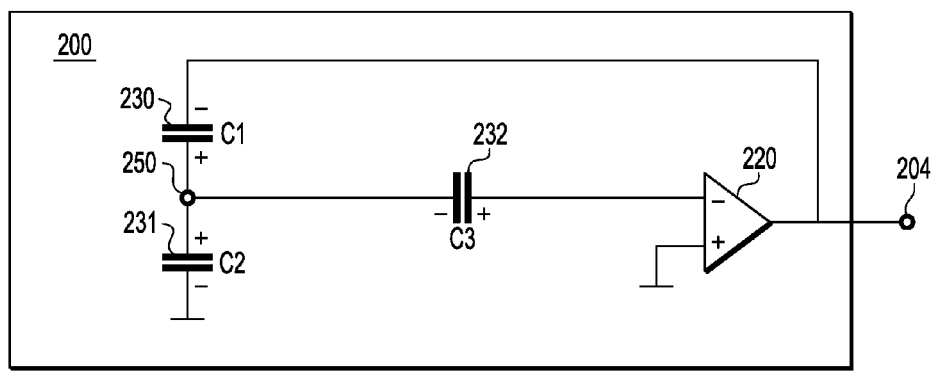
FIG. 6 is a simplified schematic diagram of the gain stage circuit of FIG. 2 in an output state, according to an example embodiment.

Referring to FIG. 6, it can be seen that, in the output state, the configuration of capacitors C1 and C2 230, 231 has not changed, but capacitor C3 232 has been coupled, at the first terminal to the inverting input to amplifier 220, and at the second terminal to the central node 250. At this point, the voltage at the central node 250 drops to zero, which represents a desirable situation. In this configuration, the output voltage, $v_{OUT}$, present at output node 204 represents a voltage signal that includes contributions from the input sample charge components stored on input sampling capacitors C1 and C2 230, 231, along with charged components stored on offset storage capacitor C3 232, which represent the amplifier offset voltage, the flicker noise, and the finite gain of amplifier 220. In this manner, the output voltage represents a signal in which the amplifier offset voltage has been cancelled, the flicker noise has been suppressed (e.g., substantially filtered out), and the finite gain of amplifier 220 has been compensated. Accordingly, gain stage circuit 200 produces an output voltage that is more accurate than is achievable using prior circuits that do not account for amplifier offset voltage, flicker noise, and/or the finite gain of amplifier 220.

During the output phase (e.g., phase 330 represented by the configuration of FIG. 6), the output voltage, $v_{OUT}$, at the output node 204 may be represented by the following equation:

$$v_{OUT} = \frac{v_{IN} G_v \left(1 + \frac{1}{A_v \beta_{5a}}\right)}{\left(1 + \frac{1}{A_v \beta_1}\right)\left(1 + \frac{1}{A_v \beta_4}\right)} +$$

$$\frac{v_{OS}\left(\frac{1}{A_v}\right)\left[\frac{1}{\beta_4}\left(1 + \frac{1}{A_v \beta_1}\right) + \frac{G_v}{\beta_3}\frac{C_2}{C_1} - \frac{C_2 C_3}{C_1^2}\right]}{\left(1 + \frac{1}{A_v}\right)\left(1 + \frac{1}{A_v \beta_1}\right)\left(1 + \frac{1}{A_v \beta_4}\right)},$$

where $G_v = \frac{C_1 + C_2}{C_1}$, $\beta_1 = \frac{C_1}{C_1 + C_2 + C_3 + C_{px}}$, $$\beta_4 = \frac{C_1 C_3}{C_1 C_3 + C_2 C_3 + C_1 C_{px} + C_2 C_{px} + C_3 C_{px}},$$

$$\beta_{5a} = \frac{C_1 C_3}{2 C_1 C_3 + 2 C_2 C_3 + C_1 C_{px} + C_2 C_{px} + C_3 C_{px}},$$

$A_v$ represents the open loop gain of amplifier 220, and $C_{px}$ represents the parasitic capacitance between the inverting node of amplifier 220 and a ground reference. In the above equation, the gain enhancement represented in the output voltage is represented by the term:

$$\frac{\left(1 + \frac{1}{A_v \beta_{5a}}\right)}{\left(1 + \frac{1}{A_v \beta_1}\right)\left(1 + \frac{1}{A_v \beta_4}\right)}.$$

The gain enhancement provided by embodiments of the gain stage circuit 200 represent an advantage over prior circuits, in which no gain enhancement is provided.

Figure 7:
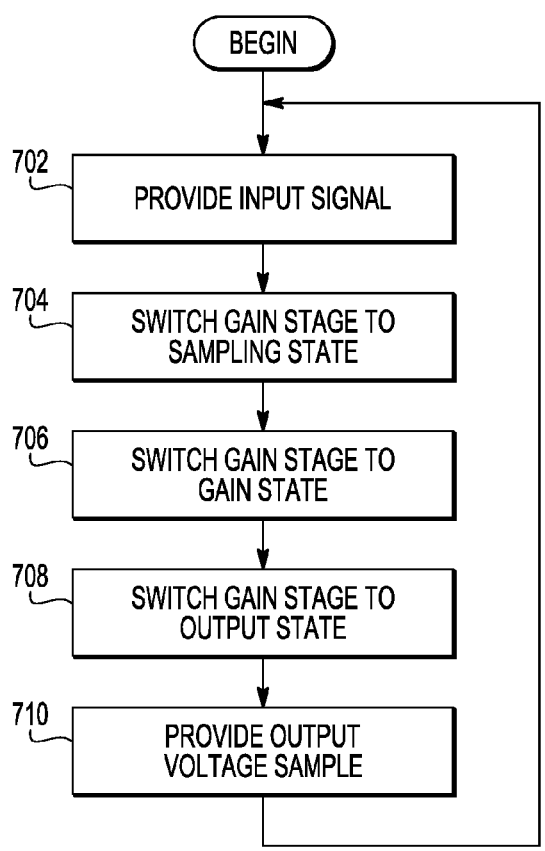
FIG. 7 is a flowchart of a method for operating an embodiment of a gain stage circuit, according to an example embodiment.

To summarize the state transitions implemented in the gain stage circuit 200, FIG. 7 is provided, which is a flowchart of a method for operating gain stage circuit 200, according to an example embodiment. The method begins, in block 702, by providing an input signal at an input node 202 of the gain stage circuit 200. In block 704, switch control signals (e.g., signals 301-305, FIG. 3) are provided by switch control circuitry 260, in order to place the gain stage circuit 200 in a sampling state (e.g., the state represented in FIG. 4). In this state, charge components representing the input voltage, $v_{IN}$, are stored on the sampling capacitors (e.g., capacitors C1 230 and C2 231), and charge components representing the voltage offset, $v_{OS}$, and flicker noise are stored on the offset storage capacitor (e.g., capacitor C3 232).

Next, in block 706, switch control signals are provided to place the gain stage circuit 200 in a gain state (e.g., the state represented in FIG. 5). In this state, charge components representing the amplifier offset voltage and flicker noise remain on the offset storage capacitor (e.g., capacitor C3 232), and a charge component representing the finite amplifier gain also is stored on the offset storage capacitor. Next, in block 708, switch control signals are provided to place the gain stage circuit 200 in an output state (e.g., the state represented in FIG. 6). In this state, the output voltage, $v_{OUT}$, is present at the output node (e.g., output node 204). As described above, the output voltage represents a voltage signal in which the charge components representing the input signal, the amplifier offset voltage, the flicker noise, and the finite gain of the amplifier contribute to the output signal, resulting in cancellation of the amplifier offset voltage, suppression of the flicker noise, and compensation for the finite gain of amplifier 220.

At this point, the output voltage represents a valid sample of an amplified version of the input signal. Accordingly, in block 710, the output voltage sample may then be provided to and further processed by additional circuitry with which the gain stage circuit 200 is implemented (e.g., by A/D converter 108 and processor 110, FIG. 1). The method then iterates as shown.

Figure 8:
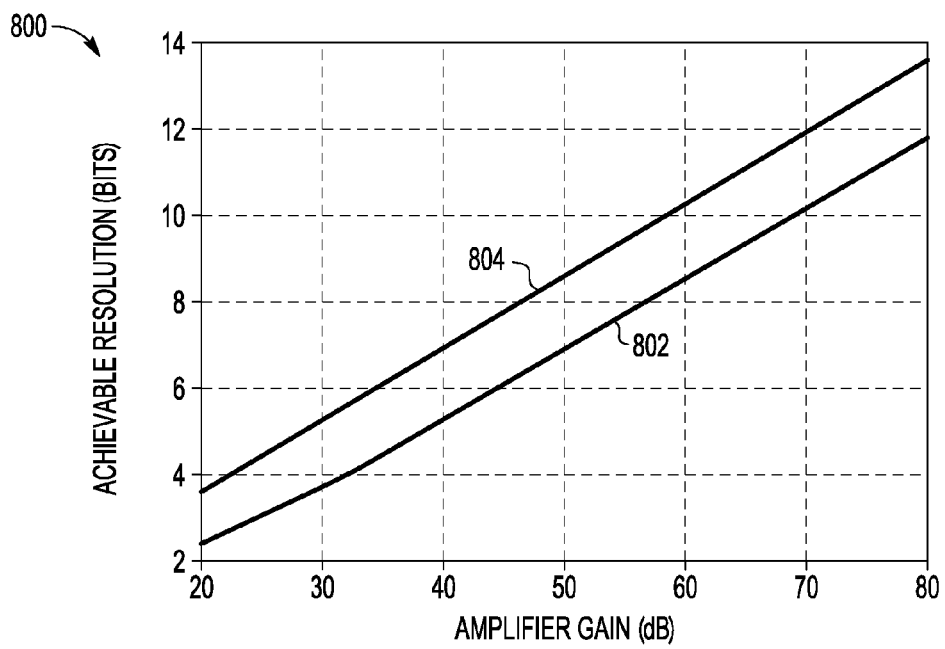
FIG. 8 is a graph plotting amplifier gain versus resolution to compare performance of an embodiment of a gain stage and a prior gain stage.
Figure 9:
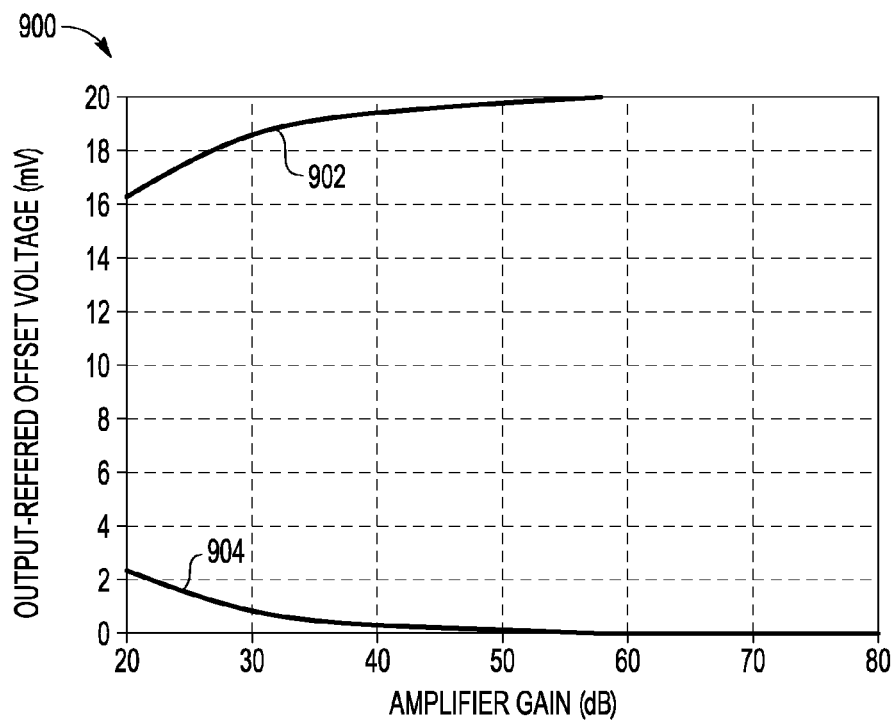
FIG. 9 is a graph plotting amplifier gain versus output-referred offset voltage to compare performance of an embodiment of a gain stage and a prior gain stage.
Figure 10:
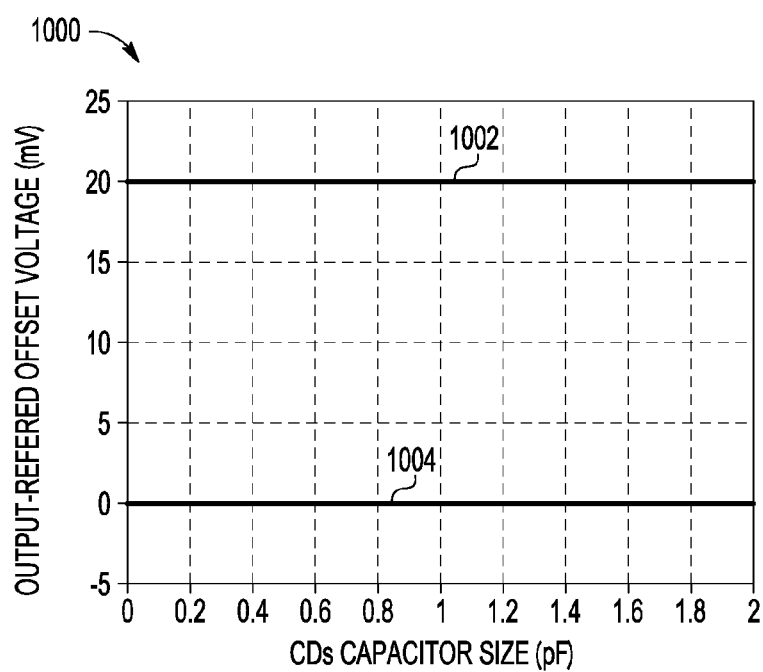
FIG. 10 is a graph plotting capacitor size versus output-referred offset voltage to compare performance of an embodiment of a gain stage and a prior gain stage.

The previously discussed characteristics of the above-described embodiments of gain stage circuits and methods of their operation may yield significant performance benefits. FIGS. 8-10 are graphs comparing characteristics of prior gain stages with characteristics of a gain stage in accordance with an embodiment. For example, FIG. 8 is a graph 800 plotting amplifier gain versus resolution to compare performance of an embodiment of a gain stage and a prior gain stage. This performance metric may be relevant, for example, when a gain stage circuit is incorporated into a system that includes an A/D converter (e.g., as an input stage), where the "achievable resolution" represents the achievable resolution (in bits) of the A/D converter. Trace 802 indicates the amplifier gain versus resolution characteristics of a prior gain stage, and trace 804 indicates the amplifier gain versus resolution characteristics of a gain stage circuit according to an embodiment (e.g., circuit 200, FIG. 2). As the graph 800 indicates, embodiments of a gain stage circuit may result in an increase of about two bits of resolution over a wide range of amplifier gain values (e.g., at an amplifier gain of 70 dB, a prior circuit has about 10 bits of resolution, and a gain stage circuit of an embodiment has about 12 bits of resolution).

FIG. 9 is a graph 900 plotting amplifier gain versus output-referred offset voltage to compare performance of an embodiment of a gain stage and a prior gain stage. Trace 902 indicates the amplifier gain versus output-referred offset voltage of a prior gain stage, and trace 904 indicates the amplifier gain versus output-referred offset voltage of a gain stage circuit according to an embodiment (e.g., circuit 200, FIG. 2). As the graph 900 indicates, embodiments of a gain stage circuit may result in a significant decrease in the output-referred offset voltage across a wide range of amplifier gain values (e.g., at an amplifier gain of 60 dB, a prior circuit has about 20 millivolts (mV) of output-referred offset voltage, and a gain stage of an embodiment has almost zero output-referred offset voltage).

Finally, FIG. 10 is a graph 1000 plotting offset storage capacitor size versus output-referred offset voltage to compare performance of an embodiment of a gain stage and a prior gain stage. Trace 1002 indicates the output-referred offset voltage of a prior gain stage that does not include an offset storage capacitor, and trace 1004 indicates the offset storage capacitor size versus output-referred offset voltage of a gain stage circuit according to an embodiment (e.g., circuit 200, FIG. 2). As the trace 1004 indicates, using an embodiment of a gain stage described herein, the output-referred offset voltage remains substantially zero over a wide range of offset storage capacitor sizes. Accordingly, a wide range of offset storage capacitor sizes may be selected for the offset storage capacitor (e.g., capacitor C3 232, FIG. 2). Accordingly, the design constraints regarding the offset storage capacitor included in an embodiment of a gain stage circuit are very liberal.

Along with the performance and other benefits discussed above, embodiments may have other advantages over prior circuits, as well. For example, the above-described embodiments enable significantly more accurate, amplified voltage signals to be produced without adding significant additional hardware to the system. As described above, an embodiment may be implemented with the addition of a single capacitor and a switching configuration designed to interconnect the various components of the gain stage circuit in configurations that enable the accurate output signal to be produced.

In addition, embodiments of gain stage circuits described herein do not significantly limit the frequencies of input signals (e.g., the signal bandwidth) that may be processed by the circuit embodiments. As previously described, the only period during which the input signal is coupled to the sampling capacitors is during the sampling stage (FIG. 4). At all other times (e.g., during the gain and output stages), the input signal is decoupled from the gain stage circuit. Accordingly, the gain stage circuit does not limit the frequency of the input signal.

Thus, various embodiments of gain stage circuits and methods of their operation have been described above. An embodiment of a switched-capacitor gain stage circuit having an input node and an output node is provided. The circuit includes an operational amplifier having a first amplifier input, a second amplifier input, and an amplifier output coupled to the output node, a plurality of sampling capacitors arranged in parallel and selectively coupled between the input node and a central node, an offset storage capacitor having a first terminal coupled to the first input of the operational amplifier, and a switching configuration having multiple switches that are configurable to place the gain stage circuit in a sampling state, a gain state, and an output state. In the sampling state, the multiple switches are configured so that a first charge component representing an input signal on the input node is stored on the sampling capacitors, and a second charge component representing an amplifier offset voltage is stored on the offset storage capacitor. In the gain state, the multiple switches are configured so that a third charge component representing a finite gain of the amplifier is stored on the offset storage capacitor. In the output state, the multiple switches are configured so that the first, second, and third charge components contribute to an output signal produced at the output node.

In a further embodiment, contribution of the second charge component to the output signal causes cancellation of the amplifier offset voltage from the output signal, and contribution of the third charge component to the output signal results in a gain enhancement to the output signal.

In another further embodiment, in the gain state, a fourth charge component representing flicker noise is stored on the offset storage capacitor. The fourth charge component results in attenuation of the flicker noise in the output signal.

In yet another further embodiment, the multiple switches are configured, in the sampling state, to connect first terminals of the plurality of sampling capacitors to the input node, and to connect second terminals of the plurality of sampling capacitors to a first ground reference, to connect a second terminal of the offset storage capacitor to a second ground reference, and to connect the amplifier output to the first amplifier input.

In yet another further embodiment, the multiple switches are configured, in the gain state, to connect the second terminals of the plurality of sampling capacitors to the central node, to connect a first terminal of a first one of the plurality of sampling capacitors to a first ground reference, and to connect a first terminal of a second one of the plurality of sampling capacitors to the amplifier output, and to connect the first terminal of the offset storage capacitor to the central node and to the first amplifier input, and to connect a second terminal of the offset storage capacitor to a second ground reference.

In yet another further embodiment, the multiple switches are configured, in the output state, to connect the second terminals of the plurality of sampling capacitors to the central node, to connect a first terminal of a first one of the plurality of sampling capacitors to a ground reference, and to connect a first terminal of a second one of the plurality of sampling capacitors to the amplifier output, and to connect the first terminal of the offset storage capacitor to the first amplifier input, and to connect a second terminal of the offset storage capacitor to the central node.

In yet another further embodiment, the plurality of storage capacitors includes a first sampling capacitor and a second sampling capacitor, and the multiple switches include a first switch coupled between the first sampling capacitor and the input node, a second switch coupled between the second sampling capacitor and the input node, a third switch coupled between the offset storage capacitor and a central node, a fourth switch coupled between the amplifier output and a first connection point between the first sampling capacitor and the first switch, a fifth switch coupled between a first ground reference and a second connection point between the second sampling capacitor and the second switch, a sixth switch coupled between a second ground reference and a third connection point between the offset storage capacitor and the third switch, a seventh switch coupled between a third ground reference and the central node, an eighth switch coupled between the central node and the first amplifier input, and a ninth switch coupled between the amplifier output and the first amplifier input.

In yet another further embodiment, the multiple switches are configurable to place the gain stage circuit in the sampling state, the gain state, and the output state in response to a plurality of switch control signals.

An embodiment of an electronic system includes a correlated-double-sampling switched-capacitor gain stage circuit having an input node, an output node, and a central node. The gain stage circuit includes an operational amplifier having a first amplifier input, a second amplifier input, and an amplifier output coupled to the output node, a first capacitor that can be selectively coupled between the input node and the central node, a second capacitor coupled in parallel with the first capacitor, and that can be selectively coupled between the input node and the central node, a third capacitor coupled to the first amplifier input, and that can be selectively coupled to the central node, and a switching configuration having multiple switches that are configurable to place the gain stage circuit in a first configuration, a second configuration, and a third configuration. In the first configuration a first charge component representing an input signal on the input node is stored on the first and second capacitors, and a second charge component representing an amplifier offset voltage is stored on the third capacitor. In the second configuration, a third charge component representing a finite gain of the amplifier is stored on the third capacitor. In the third configuration, the first, second, and third charge components contribute to an output signal produced at the output node.

In a further embodiment, the multiple switches include a first switch coupled between the first capacitor and the input node, a second switch coupled between the second capacitor and the input node, a third switch coupled between the third capacitor and the central node, a fourth switch coupled between the amplifier output and a first connection point between the first capacitor and the first switch, a fifth switch coupled between a first ground reference and a second connection point between the second capacitor and the second switch, a sixth switch coupled between a second ground reference and a third connection point between the third capacitor and the third switch, a seventh switch coupled between a third ground reference and the central node, an eighth switch coupled between the central node and the first amplifier input, and a ninth switch coupled between the amplifier output and the first amplifier input.

In another further embodiment, the electronic system further includes a switch control circuit coupled to the gain stage circuit, and configured to provide switch control signals to the multiple switches to sequentially place the gain stage circuit in the first, second, and third configurations.

In yet another further embodiment, the electronic system is an analog to digital converter, and the gain stage circuit is an input stage to the analog to digital converter. In yet another further embodiment, the electronic system is a system selected from a group consisting of a computer, a wired communication device, a wireless communication device, a cellular telephone, a radio, a radio frequency (RF) receiver, an RF transmitter, an appliance, a gaming system, a sensor interface, an electricity meter, a power meter, a video recording and display system, a vehicle braking unit, and an engine control unit.

An embodiment of a method for applying a gain to an input signal is performed in a switched-capacitor gain stage circuit having an input node, an output node, a first sampling capacitor, a second sampling capacitor, and an operational amplifier having a first amplifier input, a second amplifier input, and an amplifier output coupled to the output node. The method includes the step of first configuring multiple switches of the gain stage circuit in a first configuration in which a first charge component representing an input signal on the input node is stored on the first and second sampling capacitors, and a second charge component representing an amplifier offset voltage is stored on a third capacitor that has a first terminal coupled to the first amplifier input. The method also includes the steps of second configuring the multiple switches in a second configuration in which a third charge component representing a finite gain of the amplifier is stored on the third capacitor, and third configuring the multiple switches in a third configuration in which the first, second, and third charge components contribute to an output signal produced at the output node.

In a further embodiment, configuring the multiple switches in the first configuration includes connecting first terminals of the first and second sampling capacitors to the input node, wherein second terminals of the first and second sampling capacitors are connected to a central node, connecting the central node to a first ground reference, connecting a second terminal of the third capacitor to a second ground reference, and connecting the amplifier output to the first amplifier input.

In another further embodiment, configuring the multiple switches in the second configuration includes disconnecting the first terminals of the first and second capacitors from the input node, disconnecting the amplifier output from the first amplifier input, disconnecting the central node from the first ground reference, connecting the first terminal of the first sampling capacitor to the amplifier output, connecting the first terminal of the second sampling capacitor to a third ground reference, and connecting the first terminal of the third capacitor to the central node.

In yet another further embodiment, configuring the multiple switches in the third configuration includes disconnecting the first terminal of the third capacitor from the central node, disconnecting the second terminal of the third capacitor from the second ground reference, and connecting the second terminal of the third capacitor to the central node.

In yet another further embodiment, the method further includes repeatedly performing the first, second, and third configuring steps. In yet another further embodiment, the method further includes receiving switch control signals that cause the multiple switches to be configured in the first, second, and third configurations.

The terms "first," "second," "third," "fourth" and the like in the description and the claims, if any, may be used for distinguishing between similar elements or steps and not necessarily for describing a particular sequential or chronological order. It is to be understood that the terms so used are interchangeable under appropriate circumstances such that the embodiments described herein are, for example, capable of operation or fabrication in sequences or arrangements other than those illustrated or otherwise described herein. In addition, the sequence of processes, blocks or steps depicted in and described in conjunction with any flowchart is for example purposes only, and it is to be understood that various processes, blocks or steps may be performed in other sequences and/or in parallel, in other embodiments, and/or that certain ones of the processes, blocks or steps may be combined, deleted or broken into multiple processes, blocks or steps, and/or that additional or different processes, blocks or steps may be performed in conjunction with the embodiments. Furthermore, the terms "comprise," "include," "have" and any variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus.

It is to be understood that various modifications may be made to the above-described embodiments without departing from the scope of the inventive subject matter. While the principles of the inventive subject matter have been described above in connection with specific systems, apparatus, and methods, it is to be clearly understood that this description is made only by way of example and not as a limitation on the scope of the inventive subject matter.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A switched-capacitor gain stage circuit having an input node and an output node, the circuit comprising:
    an operational amplifier having a first amplifier input, a second amplifier input, and an amplifier output coupled to the output node;
    a plurality of sampling capacitors arranged in parallel and selectively coupled between the input node and a central node;
    an offset storage capacitor having a first terminal coupled to the first amplifier input; and
    a switching configuration having multiple switches that are configurable to place the gain stage circuit in a sampling state, a gain state, and an output state, wherein,
    in the sampling state, the multiple switches are configured so that a first charge component representing an input signal on the input node is stored on the sampling capacitors, and a second charge component representing an amplifier offset voltage is stored on the offset storage capacitor,
    in the gain state, the multiple switches are configured so that a third charge component representing a finite gain of the amplifier is stored on the offset storage capacitor, and
    in the output state, the multiple switches are configured so that the first, second, and third charge components contribute to an output signal produced at the output node.

2. The circuit of claim 1, wherein contribution of the second charge component to the output signal causes cancellation of the amplifier offset voltage from the output signal, and contribution of the third charge component to the output signal results in a gain enhancement to the output signal.

3. The circuit of claim 1, wherein:
    in the gain state, a fourth charge component representing flicker noise is stored on the offset storage capacitor.

4. The circuit of claim 3, wherein:
    in the output state, the fourth charge component results in attenuation of the flicker noise in the output signal.

5. The circuit of claim 1, wherein the multiple switches are configured, in the sampling state:
    to connect first terminals of the plurality of sampling capacitors to the input node, and to connect second terminals of the plurality of sampling capacitors to a first ground reference,
    to connect a second terminal of the offset storage capacitor to a second ground reference, and
    to connect the amplifier output to the first amplifier input.

6. The circuit of claim 1, wherein the multiple switches are configured, in the gain state:
    to connect the second terminals of the plurality of sampling capacitors to the central node, to connect a first terminal of a first one of the plurality of sampling capacitors to a first ground reference, and to connect a first terminal of a second one of the plurality of sampling capacitors to the amplifier output, and
    to connect the first terminal of the offset storage capacitor to the central node and to the first amplifier input, and to connect a second terminal of the offset storage capacitor to a second ground reference.

7. The circuit of claim 1, wherein the multiple switches are configured, in the output state:
    to connect the second terminals of the plurality of sampling capacitors to the central node, to connect a first terminal of a first one of the plurality of sampling capacitors to a ground reference, and to connect a first terminal of a second one of the plurality of sampling capacitors to the amplifier output, and
    to connect the first terminal of the offset storage capacitor to the first amplifier input, and to connect a second terminal of the offset storage capacitor to the central node.

8. The circuit of claim 1, wherein:
    the plurality of storage capacitors comprises a first sampling capacitor and a second sampling capacitor; and
    the multiple switches comprise
        a first switch coupled between the first sampling capacitor and the input node,
        a second switch coupled between the second sampling capacitor and the input node,
        a third switch coupled between the offset storage capacitor and a central node,
        a fourth switch coupled between the amplifier output and a first connection point between the first sampling capacitor and the first switch,
        a fifth switch coupled between a first ground reference and a second connection point between the second sampling capacitor and the second switch,
        a sixth switch coupled between a second ground reference and a third connection point between the offset storage capacitor and the third switch,
        a seventh switch coupled between a third ground reference and the central node,
        an eighth switch coupled between the central node and the first amplifier input, and
        a ninth switch coupled between the amplifier output and the first amplifier input.

9. The circuit of claim 1, wherein the multiple switches are configurable to place the gain stage circuit in the sampling state, the gain state, and the output state in response to a plurality of switch control signals.

10. An electronic system comprising:
    a correlated-double-sampling switched-capacitor gain stage circuit having an input node, an output node, and a central node, the gain stage circuit including
        an operational amplifier having a first amplifier input, a second amplifier input, and an amplifier output coupled to the output node;
        a first capacitor that can be selectively coupled between the input node and the central node;

a second capacitor coupled in parallel with the first capacitor, and that can be selectively coupled between the input node and the central node;

a third capacitor coupled to the first amplifier input, and that can be selectively coupled to the central node; and a switching configuration having multiple switches that are configurable to place the gain stage circuit in a first configuration, a second configuration, and a third configuration, wherein, in the first configuration a first charge component representing an input signal on the input node is stored on the first and second capacitors, and a second charge component representing an amplifier offset voltage is stored on the third capacitor, in the second configuration, a third charge component representing a finite gain of the amplifier is stored on the third capacitor, and in the third configuration, the first, second, and third charge components contribute to an output signal produced at the output node.

11. The electronic system of claim 10, wherein the multiple switches comprise:

a first switch coupled between the first capacitor and the input node, a second switch coupled between the second capacitor and the input node, a third switch coupled between the third capacitor and the central node, a fourth switch coupled between the amplifier output and a first connection point between the first capacitor and the first switch, a fifth switch coupled between a first ground reference and a second connection point between the second capacitor and the second switch, a sixth switch coupled between a second ground reference and a third connection point between the third capacitor and the third switch, a seventh switch coupled between a third ground reference and the central node, an eighth switch coupled between the central node and the first amplifier input, and a ninth switch coupled between the amplifier output and the first amplifier input.

12. The electronic system of claim 10, further comprising:

a switch control circuit coupled to the gain stage circuit, and configured to provide switch control signals to the multiple switches to sequentially place the gain stage circuit in the first, second, and third configurations.

13. The electronic system of claim 10, wherein the electronic system is an analog to digital converter, and the gain stage circuit is an input stage to the analog to digital converter.

14. The electronic system of claim 10, wherein the electronic system is a system selected from a group consisting of a computer, a wired communication device, a wireless communication device, a cellular telephone, a radio, a radio frequency (RF) receiver, an RF transmitter, an appliance, a gaming system, a sensor interface, an electricity meter, a power meter, a video recording and display system, a vehicle braking unit, and an engine control unit.

15. A method for applying a gain to an input signal, the method performed in a switched-capacitor gain stage circuit having an input node, an output node, a first sampling capacitor, a second sampling capacitor, and an operational amplifier having a first amplifier input, a second amplifier input, and an amplifier output coupled to the output node, the method comprising the steps of:

first configuring multiple switches of the gain stage circuit in a first configuration in which a first charge component representing an input signal on the input node is stored on the first and second sampling capacitors, and a second charge component representing an amplifier offset voltage is stored on a third capacitor that has a first terminal coupled to the first amplifier input;

second configuring the multiple switches in a second configuration in which a third charge component representing a finite gain of the amplifier is stored on the third capacitor; and third configuring the multiple switches in a third configuration in which the first, second, and third charge components contribute to an output signal produced at the output node.

16. The method of claim 15, wherein configuring the multiple switches in the first configuration comprises:

connecting first terminals of the first and second sampling capacitors to the input node, wherein second terminals of the first and second sampling capacitors are connected to a central node;

connecting the central node to a first ground reference;

connecting a second terminal of the third capacitor to a second ground reference; and connecting the amplifier output to the first amplifier input.

17. The method of claim 16, wherein configuring the multiple switches in the second configuration comprises:

disconnecting the first terminals of the first and second capacitors from the input node;

disconnecting the amplifier output from the first amplifier input;

disconnecting the central node from the first ground reference;

connecting the first terminal of the first sampling capacitor to the amplifier output;

connecting the first terminal of the second sampling capacitor to a third ground reference; and connecting the first terminal of the third capacitor to the central node.

18. The method of claim 17, wherein configuring the multiple switches in the third configuration comprises:

disconnecting the first terminal of the third capacitor from the central node;

disconnecting the second terminal of the third capacitor from the second ground reference; and connecting the second terminal of the third capacitor to the central node.

19. The method of claim 15, further comprising:

repeatedly performing the first, second, and third configuring steps.

20. The method of claim 15, further comprising:

receiving switch control signals that cause the multiple switches to be configured in the first, second, and third configurations.

* * * * *